(12) United States Patent
Yong et al.

(10) Patent No.: US 12,532,756 B2
(45) Date of Patent: Jan. 20, 2026

(54) SEMICONDUCTOR PACKAGE, AND MEMORY MODULE INCLUDING THE SAME

(71) Applicant: SAMSUNG ELECTRONICS CO., LTD., Suwon-si (KR)

(72) Inventors: Seokbeom Yong, Yongin-si (KR); Dongchul Yang, Suwon-si (KR); Yunhee Lee, Seoul (KR); Seungsoo Ha, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 909 days.

(21) Appl. No.: 17/827,018

(22) Filed: May 27, 2022

(65) Prior Publication Data

US 2023/0130453 A1 Apr. 27, 2023

(30) Foreign Application Priority Data

Oct. 21, 2021 (KR) .................. 10-2021-0141365

(51) Int. Cl.
*H01L 23/498* (2006.01)
*H01L 25/10* (2006.01)
*H01L 25/18* (2023.01)

(52) U.S. Cl.
CPC ...... *H01L 23/49838* (2013.01); *H01L 25/105* (2013.01); *H01L 25/18* (2013.01)

(58) Field of Classification Search
CPC . H01L 23/49838; H01L 25/105; H01L 25/18; H01L 23/49816; H01L 24/16; H01L 24/48; H01L 2224/16227; H01L 2224/32145; H01L 2224/32225; H01L 2224/48227; H01L 2224/73265; H01L 2225/0651; H01L 2225/06562;
(Continued)

(56) References Cited

U.S. PATENT DOCUMENTS 6,870,273 B2 3/2005 Tao et al.
8,324,019 B2 12/2012 Tang et al.
(Continued)

FOREIGN PATENT DOCUMENTS

JP 2015-149340 A 8/2015
JP 6039380 B2 12/2016
KR 10-2014-0042717 A 4/2014

OTHER PUBLICATIONS

Office Action in Korean Appln. No. 10-2021-0141365, mailed on Aug. 6, 2025, 14 pages (with English translation).

*Primary Examiner* — Benjamin Tzu-Hung Liu
(74) *Attorney, Agent, or Firm* — Fish & Richardson P.C.

(57) ABSTRACT

Provided is a semiconductor package with high reliability signal characteristics and a memory module including the semiconductor package. The semiconductor package includes a package substrate, a semiconductor chip mounted on the package substrate, and connection terminals arranged on a lower surface of the package substrate. The connection terminals are arranged in a two-dimensional array structure in a first direction and a second direction perpendicular to the first direction, and two adjacent terminals with a shortest distance therebetween among data signal (DQ) terminals and command and address signal (CA) terminals included in the connection terminals are arranged in a diagonal direction between the first direction and the second direction.

16 Claims, 16 Drawing Sheets

(58) Field of Classification Search
CPC . H01L 2225/06586; H01L 2924/15192; H01L 2924/15311; H01L 2225/1017
See application file for complete search history.

(56) References Cited

U.S. PATENT DOCUMENTS

| | | |
|---|---|---|
| 9,123,554 B2 | 9/2015 | Kuroda et al. |
| 10,679,956 B2* | 6/2020 | Kim .......................... G11C 5/06 |
| 2016/0093563 A1* | 3/2016 | Chen ................. H01L 23/49822 |
| | | 361/752 |
| 2018/0247889 A1* | 8/2018 | Nagasato ............ H01L 23/5286 |
| 2019/0278511 A1* | 9/2019 | Lee ...................... G11C 7/1066 |
| 2023/0063542 A1* | 3/2023 | Yeh ..................... H01L 25/0655 |

* cited by examiner

SEMICONDUCTOR PACKAGE, AND MEMORY MODULE INCLUDING THE SAME

CROSS-REFERENCE TO RELATED APPLICATION

This application is based on and claims priority under 35 U.S.C. § 119 to Korean Patent Application No. 10-2021-0141365, filed on Oct. 21, 2021, in the Korean Intellectual Property Office, the disclosure of which is incorporated by reference herein in its entirety.

BACKGROUND

The inventive concept relates to a semiconductor package, and more particularly, to a semiconductor package including a package substrate in which connection terminals are arranged in a two-dimensional array structure.

Electronic devices are have gradually reduced in size and weight in response to the rapid development of the electronics industry and the demands of its users. As a result of the reduction of electronic devices, semiconductor packages have also reduced in size and weight and are required to have high reliability along with high performance and large capacity. In addition, a semiconductor chip may be mounted on a printed circuit board (PCB) of the semiconductor package in a wire bonding structure or a flip-chip structure, and the PCB may be mounted on a board substrate through connection terminals such as solder balls. Here, the connection terminals may be arranged on a lower surface of the PCB in a two-dimensional array structure.

SUMMARY

The inventive concept provides a semiconductor package with high reliability of signal characteristics, and a memory module including the semiconductor package.

In addition, problems to be solved by the technical idea of the inventive concept are not limited to the problems described above, and other problems solved may be clearly understood by those skilled in the art from following description.

According to an aspect of the inventive concept, a semiconductor package includes a package substrate, a semiconductor chip mounted on the package substrate, and connection terminals arranged on a lower surface of the package substrate, wherein the connection terminals may be arranged in a two-dimensional array structure in a first direction and a second direction perpendicular to the first direction, and two adjacent terminals with a shortest distance therebetween among data signal (DQ) terminals and command and address signal (CA) terminals included in the connection terminals that may be arranged in a diagonal direction between the first direction and the second direction.

According to another aspect of the inventive concept, a memory module includes a first semiconductor package including a first package substrate, a first semiconductor chip mounted over the first package substrate, and connection terminals arranged on a lower surface of the first package substrate, a second semiconductor package including a second package substrate and a second semiconductor chip mounted on the second package substrate, and a board substrate over which the first semiconductor package and the second semiconductor package are mounted and in which wires connecting the first package substrate to the second package substrate are arranged, wherein the connection terminals may be arranged in a two-dimensional array structure in a first direction and a second direction perpendicular to the first direction, and two adjacent terminals with a shortest distance therebetween among DQ terminals and CA terminals included in the connection terminals that may be arranged in a diagonal direction between the first direction and the second direction.

According to another aspect of the inventive concept, a memory module includes a first semiconductor package including a first package substrate, a first semiconductor chip mounted on the first package substrate, and connection terminals arranged on a lower surface of the first package substrate, a plurality of second semiconductor packages, each including a second package substrate and at least one second semiconductor chip mounted on the second package substrate, and a board substrate on which the first semiconductor package and the plurality of second semiconductor packages are mounted, and in which wires connecting the first package substrate to the plurality of second package substrates are arranged, wherein the connection terminals may be arranged in a two-dimensional array structure in a first direction and a second direction perpendicular to the first direction and include channel terminals and ground terminals arranged in at least two channel regions, two adjacent terminals with a shortest distance therebetween among DQ terminals and CA terminals included in the connection terminals that may be arranged in a diagonal direction between the first direction and the second direction, and a first channel region and a second channel region which are adjacent to each other among the at least two channel regions that may be coupled in a dovetail joint structure.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
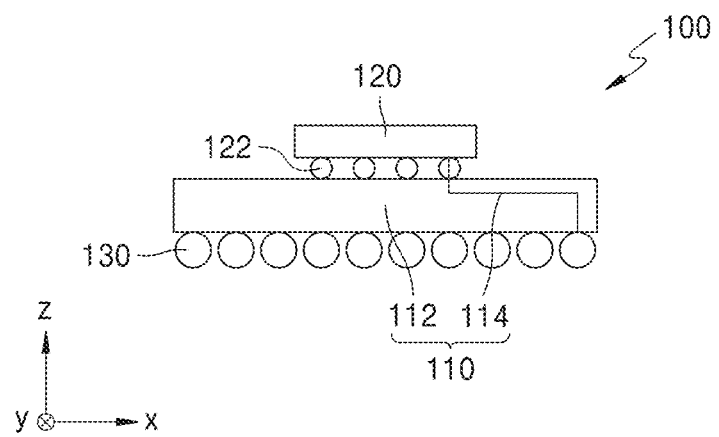
FIG. 1 is a schematic cross-sectional view illustrating a semiconductor package according to an exemplary embodiment of the inventive concept.

Hereinafter, exemplary embodiments of the inventive concept are described in detail with reference to the accompanying drawings. The same reference numerals are used for the same components in the drawings, and redundant descriptions thereof are omitted.

FIG. 1 is a schematic cross-sectional view illustrating a semiconductor package according to an exemplary embodiment of the inventive concept.

Referring to FIG. 1, a semiconductor package 100 according to the present exemplary embodiment may include a package substrate 110, a semiconductor chip 120, and connection terminals 130.

The package substrate 110 may include a body layer 112 and a wire 114. The body layer 112 may be formed of various materials. For example, the body layer 112 may be formed of silicon, ceramic, an organic material, glass, an epoxy resin, or so on, depending on the type of the package substrate 110. In the semiconductor package 100 according to the present exemplary embodiment, the package substrate 110 may include a printed circuit board (PCB), and the body layer 112 may be formed based on an epoxy resin. The body layer 112 may constitute an outer shape of the package substrate 110. For example, the body layer 112 may have a rectangular plate shape. However, the shape of the body layer 112 is not limited to a rectangular plate shape.

The wire 114 may be on an upper surface, a lower surface of the body layer 112, and on the inside of the body layer 112. FIG. 1 illustrates only one wire 114 for the purpose of illustrating a signal path, but a plurality of wires 114 may be arranged in the body layer 112. In addition, the wires 114 may be arranged in a single layer or multiple layers in the body layer 112. When the wires 114 are arranged in multiple layers, the wires 114 in different layers may be connected to each other through vias.

Protective layers may be respectively formed on lower and upper surfaces of the body layer 112. The protective layers may cover and protect wires on the upper and lower surfaces of the body layer 112. The protective layers may each be formed of, for example, solder resist (SR). However, materials of the protective layers are not limited to SR. In addition, substrate pads may be arranged on the upper and lower surfaces of the body layer 112. The substrate pads may be respectively connected to the wires 114 and may be exposed from the protective layers. The substrate pads may include an upper substrate pad on the upper surface of the body layer 112 and a lower substrate pad on the lower surface of the body layer 112. Bumps 122 of the semiconductor chip 120 may be arranged on the upper substrate pad, and the connection terminals 130 may be arranged on the lower substrate pad.

The semiconductor chip 120 may include, for example, a logic chip. The semiconductor chip 120 may supply a channel signal, power, and a ground voltage to another semiconductor package 300 (see FIG. 8) and receive a storage information signal from a semiconductor chip 320 (see FIG. 8) of the semiconductor package 300. The semiconductor chip 120 may include a plurality of logic elements therein to control signal processing and transmission. The logic elements may include elements such as an AND, a NAND, an OR, a NOR, an exclusive OR (XOR), an exclusive NOR (XNOR), an inverter (INV), an adder (ADD), a delay (DLY), a filter (FIL), and a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, a counter, and a buffer. The logic elements may perform various types of signal processing such as analog signal processing, analog-to-digital conversion, and control thereof.

The semiconductor chip 120 may include a processor chip. For example, the semiconductor chip 120 may include a central processing unit (CPU), a microprocessor, a controller, or an application specific integrated circuit (ASIC) chip. In addition, the semiconductor chip 120 may include an application processor (AP) chip of a system on chip (SoC) type used in a mobile system such as a mobile phone, a motion picture expert group (MPEG) audio layer-3 (MP3) player, a navigation system, or a portable media player (PMP). In the semiconductor package 100 according to the present exemplary embodiment, the semiconductor chip 120 may be referred to as an AP chip or a controller chip from a functional point of view.

For example, the semiconductor chip 120 of the semiconductor package 100 may include a volatile memory device such as dynamic random access memory (DRAM) or static random access memory (SRAM), or a nonvolatile memory device such as flash memory. For example, in the semiconductor package 100 according to the present exemplary embodiment, the semiconductor chip 120 of the semiconductor package 100, to which a signal is transmitted, may be a DRAM chip including a plurality of DRAM devices. In addition, the semiconductor chip 120 may be a double data rate (DDR) synchronous dynamic random access memory (SDRAM) chip used in a mobile system. In addition, DDR may be classified into DDR1 to DDR5 and so on depending on the generation thereof.

The semiconductor chip 120 may be mounted on the package substrate 110 through the bumps 122. For example, chip pads may be arranged on a lower surface of the semiconductor chip 120, and the bumps 122 may be respectively arranged on the chip pads. The semiconductor chip 120 may be mounted on the package substrate 110 through the bumps 122 in a flip-chip structure. The bumps 122 may physically and electrically connect chip pads of the semiconductor chip 120 respectively to upper substrate pads of the package substrate 110. In addition, in some exemplary embodiments, the semiconductor chip 120 may also be mounted on the package substrate 110 through a wire-bonding structure.

Although not illustrated in FIG. 1, an underfill may be filled between the semiconductor chip 120 and the package substrate 110. The underfill may be formed of an underfill resin such as an epoxy resin and may include asilica filler, a flux, or on the like. In another exemplary embodiment, an adhesive member may be placed between the semiconductor chip 120 and the package substrate 110 instead of the underfill. The adhesive member may include, for example, a non-conductive film (NCF), an anisotropic conductive film (ACF), an ultraviolet (UV) film, an instant adhesive, a thermosetting adhesive, a laser curing adhesive, an ultrasonic curing adhesive, or a non-conductive paste (NCP).

In addition, the semiconductor package 100 may include a sealing material for sealing the semiconductor chip 120 on the package substrate 110. The sealing material may include a thermosetting resin such as an epoxy resin, a thermoplastic resin such as polyimide, or a resin including a reinforcing material such as an inorganic filler, for example, an Ajinomoto build-up film (ABF), FR-4, a bismaleimide triazine (BT) resin, and the like. The sealing material may include, for example, a molding material such as an epoxy mold compound (EMC). However, the sealing material is not limited to the materials described above. In addition, the sealing material may be formed through a molded underfill (MUF) process, and in this case, an underfill between the semiconductor chip 120 and the package substrate 110 may be omitted.

A plurality of connection terminals 130 may be arranged on a lower surface of the package substrate 110 in a two-dimensional array structure. The semiconductor package 100 may be mounted on a board substrate 200 (see FIG. 8) through the connection terminals 130. The connection terminals 130 may include channel terminals, ground terminals, and power terminals. In the semiconductor package 100 according to the present exemplary embodiment, the channel terminals may be arranged on a lower surface of the package substrate 110 in the best arrangement structure to reduce most crosstalk between the channel terminals. Types and arrangement structures of the channel terminals of the connection terminals 130 will be described in more detail with reference to FIGS. 2A to 7.

In the semiconductor package 100 according to the present exemplary embodiment, the channel terminals of the connection terminals 130 arranged on a lower surface of the package substrate 110 may be arranged in an optimal structure. For example, when the connection terminals 130 are arranged in a two-dimensional array structure in a first direction (an x direction) and a second direction (a y direction) on the lower surface of the package substrate 110, two adjacent terminals with the shortest distance therebetween among data signal (DQ) terminals and command and address signal (CA) terminals may be arranged in a diagonal direction between the first direction (x direction) and the second direction (y direction). In addition, the DQ terminals and the CA terminals may be arranged in a zigzag structure in the first direction (x direction) or the second direction (y direction). Furthermore, at least one ground terminal may be between two adjacent terminals in the first direction (x direction) or the second direction (y direction) among the DQ terminals and the CA terminals. Crosstalk between the channel terminals of the connection terminals 130 may be reduced the most based on the arrangement structure of the connection terminals 130. Accordingly, signal integrity (SI) characteristics of the semiconductor package 100 according to the present exemplary embodiment may be greatly improved.

Figure 2A:
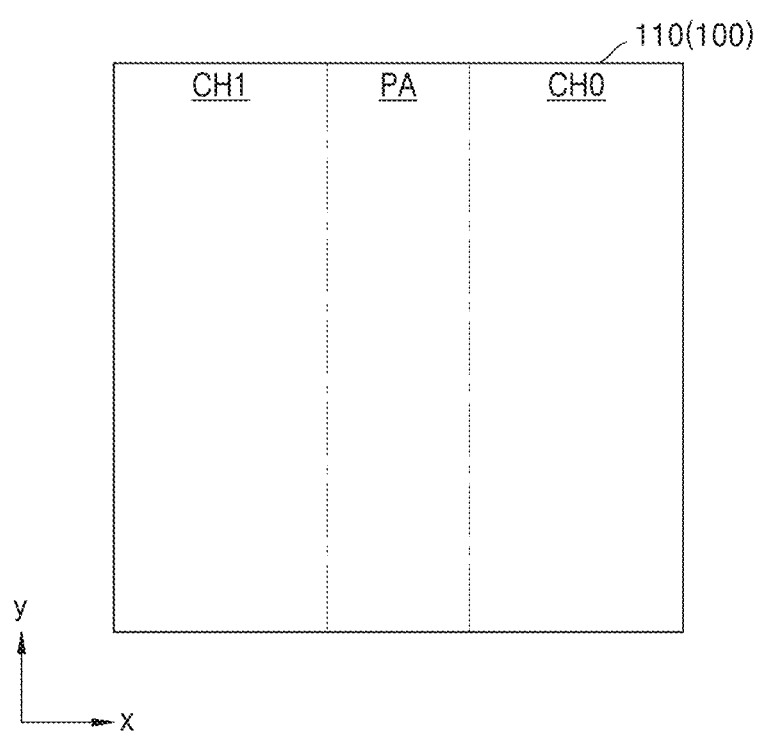
FIGS. 2A and 2B are plan views illustrating a package substrate in the semiconductor package of FIG. 1.
Figure 2B:
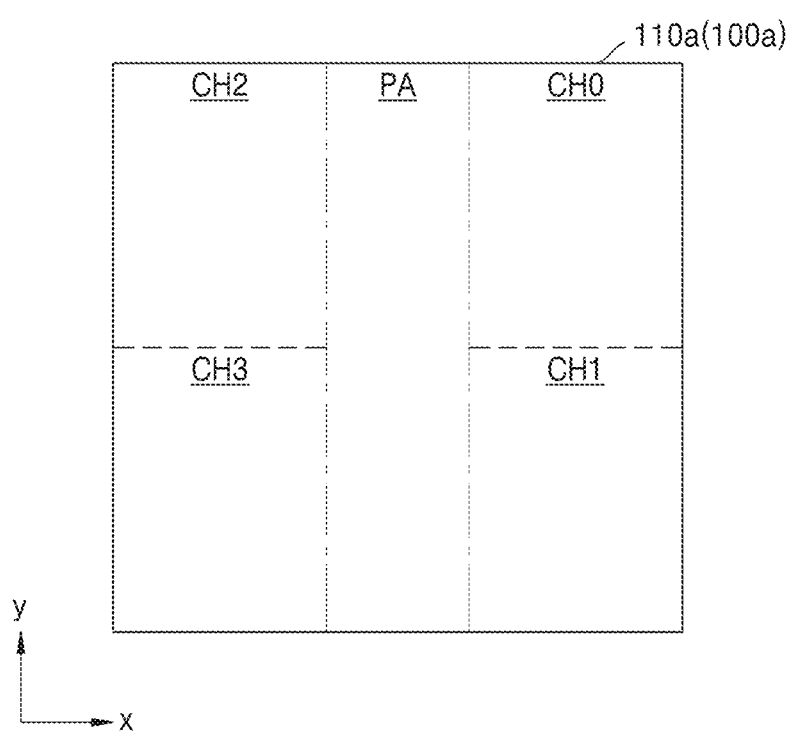

FIGS. 2A and 2B are plan views illustrating a lower surface of a package substrate of the semiconductor package in FIG. 1. The following description is made with reference to FIG. 1 and FIGS. 2A and 2B, and the previous description given with reference to FIG. 1 is omitted as redundant.

In the semiconductor package 100 according to the present exemplary embodiment illustrated in FIG. 2, the connection terminals 130 may be arranged on the lower surface of the package substrate 110. The connection terminals 130 may include channel terminals, ground terminals, and power terminals. As illustrated in FIG. 2A, the channel terminals of the connection terminals 130 may be arranged in outer portions on both sides of a lower surface of the package substrate 110, and the power terminals may be arranged on a central portion of the lower surface of the package substrate 110. Specifically, when the channel terminals of the connection terminals 130 are classified into two channels, first channel terminals corresponding to a first channel among the channel terminals are arranged in a first channel region CH0, and second channel terminals corresponding to a second channel among the channel terminals are arranged in a second channel region CH1. The first channel region CH0 and the second channel region CH1 may be arranged on the outer portions on both sides of the lower surface of the package substrate 110 in the first direction (x direction). In addition, the power terminals may be arranged in a power region PA, and the power region PA may be at the central portion of the lower surface of the package substrate 110 in the first direction (x direction).

In addition, ground terminals may be arranged in the first channel region CH0 and the second channel region CH1 in addition to the channel terminals. Moreover, the ground terminals may be arranged in the power region PA in addition to the power terminals. An arrangement structure of the channel terminals and the ground terminals in the first channel region CH0 will be described in more detail with reference to FIG. 3B.

Referring to FIG. 2B, in a semiconductor package 100a according to the present exemplary embodiment, the connection terminals 130 on a lower surface of a package substrate 110a may include channel terminals, ground terminals, and power terminals. The channel terminals of the connection terminals 130 may be classified into four channels. Accordingly, first channel terminals corresponding to a first channel among the channel terminals are arranged in a first channel region CH0, second channel terminals corresponding to a second channel among the channel terminals are arranged in a second channel region CH1. In addition, third channel terminals corresponding to a third channel may be arranged in a third channel region CH2, and fourth channel terminals corresponding to a fourth channel may be arranged in a fourth channel region CH3.

The first channel region CH0 and the second channel region CH1 are arranged in outer portions on the right of the lower surface of the package substrate 110a in the first direction (x direction), and the third channel region CH2 and the fourth channel region CH3 may be arranged in outer portions on the left of the lower surface of the package substrate 110a in the first direction (x direction). In addition, the first channel region CH0 and the second channel region CH1 may be coupled to each other in a dovetail joint structure in the second direction (y direction) and may be sequentially arranged, and the third channel region CH2 and the fourth channel region CH3 may be coupled to each other in the dovetail joint structure in the second direction (y direction) and are sequentially arranged. In addition, the power terminals may be arranged in a power region PA, and the power region PA may be arranged at a central portion of the lower surface of the package substrate 110a in the first direction (x direction).

The ground terminals may be arranged in the first to fourth channel regions CH0 to CH3 in addition to the channel terminals. In addition, the ground terminals may be arranged in the power region PA in addition to the power terminals. An arrangement structure of the channel terminals and ground terminals in the first channel region CH0 and the second channel region CH1 and a coupling structure of the first channel region CH0 and the second channel region CH1 are described in more detail with reference to FIG. 7.

In addition, in the semiconductor packages 100 and 100a of FIGS. 2A and 2B, although the connection terminals 130 arranged on the lower surfaces of the package substrates 110 and 110a are divided into 2 or 4 channels, the distinction between channels of the connection terminals 130 is not limited to thereto. For example, in some exemplary embodiments, the channels of connection terminals 130 arranged on the lower surface of the package substrate 110 or 110*a* may be 1, 3, 5, or more.

Figure 3A:
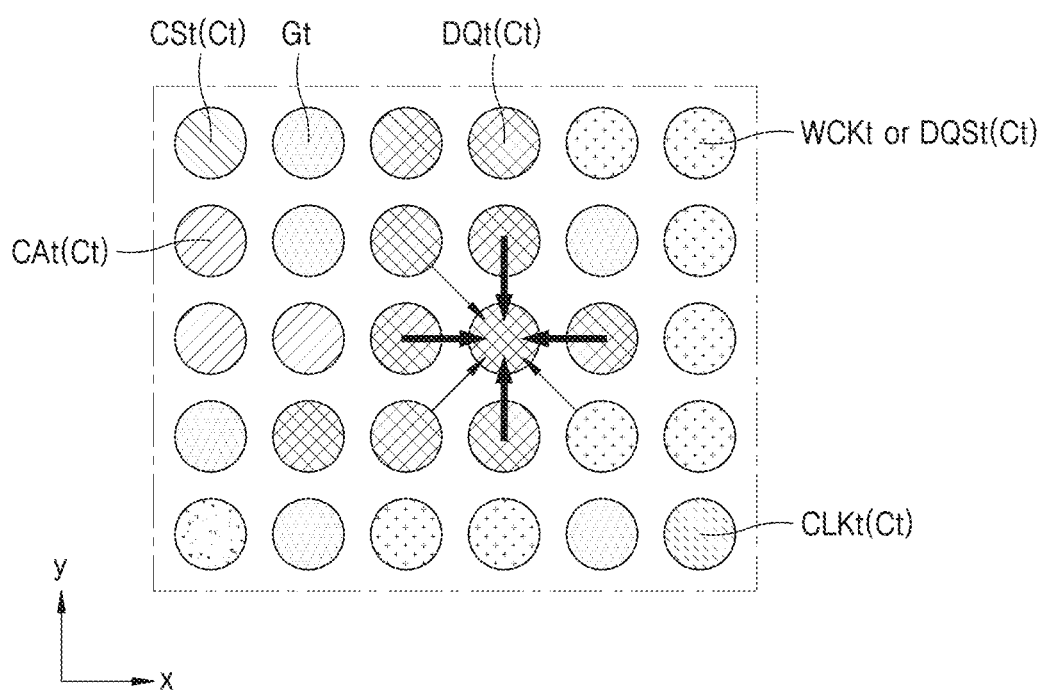
FIGS. 3A and 3B are plan views respectively illustrating an arrangement structure of connection terminals of a package substrate according to a comparative example and an arrangement structure of connection terminals on a package substrate of the semiconductor package in FIG. 1.
Figure 3B:
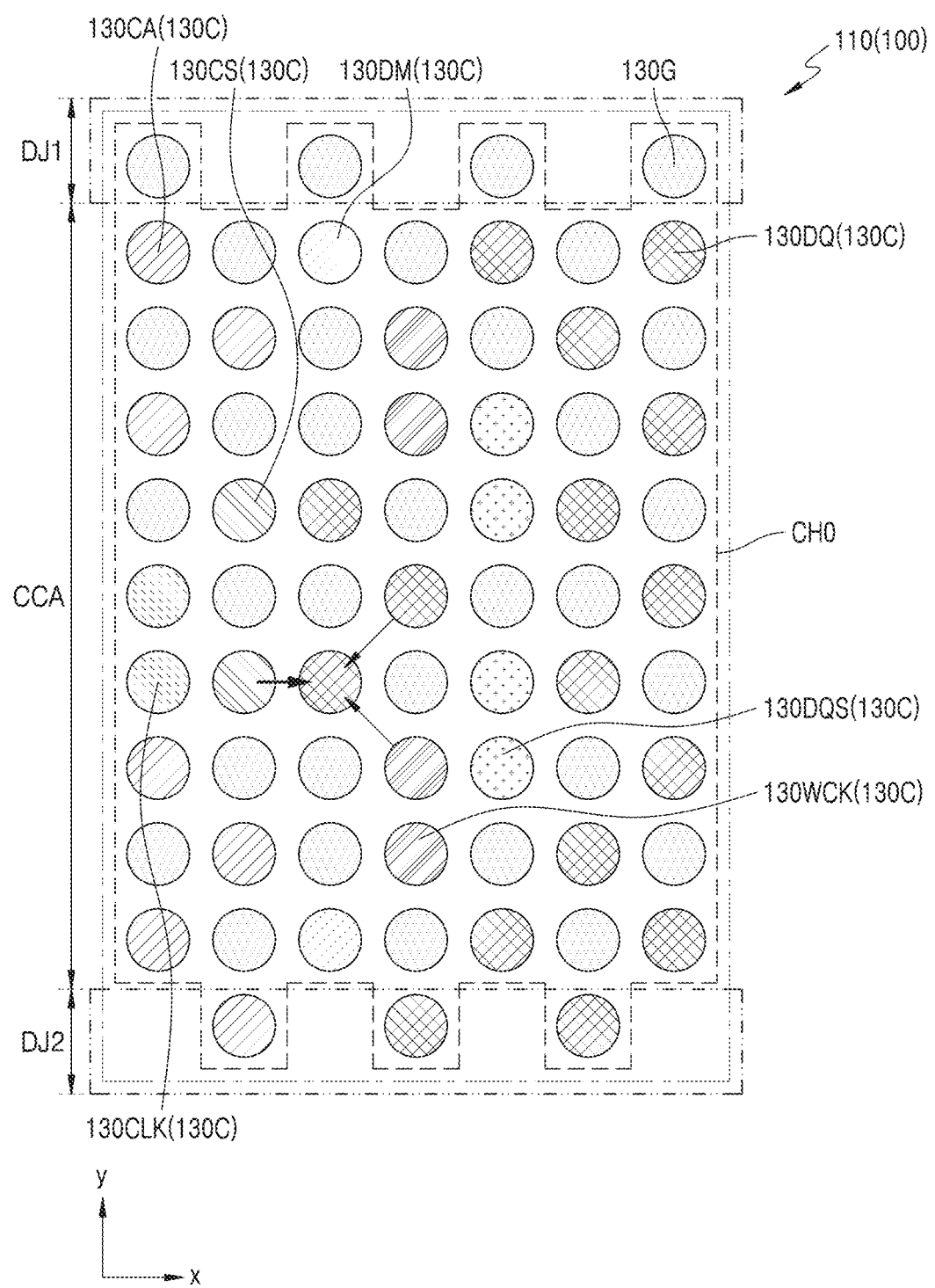
Figure 4A:
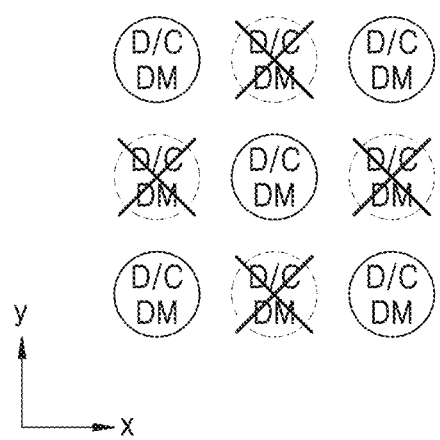
FIGS. 4A and 4B are conceptual diagrams illustrating an arrangement rule of connection terminals on a package substrate of the semiconductor package in FIG. 1.
Figure 4B:
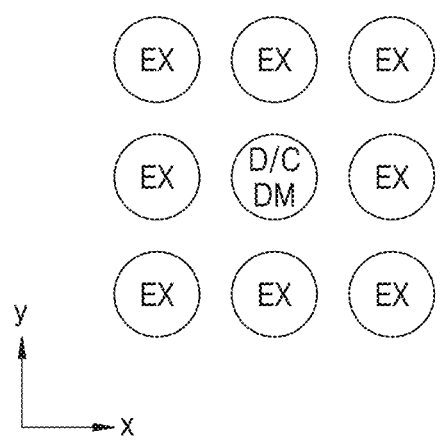

FIGS. 3A and 3B are plan views respectively illustrating an arrangement structure of connection terminals on a package substrate according to a comparative example and an arrangement structure of connection terminals of a package substrate of the semiconductor package in FIG. 1. FIGS. 4A and 4B are conceptual diagrams illustrating an arrangement rule of the connection terminals on the package substrate of the semiconductor package of FIG. 1. FIG. 3A illustrates some of the channel regions on a lower surface of the package substrate according to the comparative example. FIG. 3B illustrates a first channel region on the lower surface of the package substrate in FIG. 2A. The descriptions previously given with reference to FIGS. 1 to 2B are omitted as redundant.

Referring to FIG. 3A, channel terminals Ct and ground terminals Gt are arranged in a two-dimensional array structure on the lower surface of the package substrate according to the comparative example, and the channel terminals Ct may include DQ terminals DQt, CA terminals CAt, chip select signal (CS) terminals CSt, clock signal (CLK) terminals CLKt, data channel clock signal (WCK) or data strobe signal (DQS) terminals WCKt or DQSt, and so on. The channel terminals Ct and the ground terminals Gt may be randomly arranged on the lower surface of the package substrate according to the comparative example without any special arrangement rules. Accordingly, as indicated by arrows in FIG. 3A, six DQ terminals DQt, one WCK or DQS terminal WCKt or DQSt, and one ground terminal Gt may be arranged around one DQ terminal DQt.

Crosstalk between the channel terminals Ct, particularly, crosstalk between the DQ terminals DQt and the CA terminals CAt may increase in proportion to a distance therebetween. For example, as indicated by thicknesses of the arrows in FIG. 3A, crosstalk between the adjacent DQ terminals DQt in the first direction (x direction) and the second direction (y direction) may increase. In addition, crosstalk between the adjacent DQ terminals DQt in a diagonal direction and crosstalk between the DQ terminal DQt and the WCK or DQS terminal WCKt or DQSt in a diagonal direction may be relatively reduced. In addition, the ground terminals Gt are reference terminals and may prevent crosstalk from occurring. Accordingly, crosstalk may not occur between the DQ terminals DQt and the ground terminals Gt arranged adjacent to each other in a diagonal direction. In addition, the ground terminals Gt may prevent crosstalk from occurring between the DQ terminals DQt and the channel terminals Ct beyond the ground terminals Gt. As a result, in an arrangement structure of the channel terminals Ct on the lower surface of the package substrate according to the comparative example, the DQ terminals DQt and the CA terminals CAt may be arranged adjacent to each other in the first direction (x direction) and the second direction (y direction), and thus, crosstalk may increase and SI characteristics may be reduced.

In the semiconductor package 100 according to the present exemplary embodiment illustrated in FIG. 3B, channel terminals 130C of the connection terminals 130 may be arranged on the lower surface of the package substrate 110 in an arrangement structure for reducing crosstalk. For example, as indicated by arrows in FIG. 3B, three channel terminals 130C and five ground terminals 130G may be arranged adjacent to one DQ terminal 130DQ. As can be seen from the thicknesses of the arrows in FIG. 3B, crosstalk between DQ terminals 130DQ and CS terminals 130CS arranged adjacent to each other in the first direction (x direction) is relatively greatly increased, and crosstalk between the DQ terminals 130DQ arranged adjacent to each other in a diagonal direction and crosstalk between the DQ terminals 130DQ and the WCK terminals 130WCK arranged adjacent to each other in a diagonal direction may be reduced. In addition, five ground terminals 130G arranged around the DQ terminal 130DQ may prevent crosstalk from occurring.

In addition, a chip select signal CS has a relatively low voltage level that is constant to some extent, and has little influence on its surroundings. Accordingly, crosstalk between the adjacent DQ terminal 130DQ and CS terminal 130CS may be less than crosstalk between two adjacent DQ terminals 130DQ, crosstalk between two CA terminals 130CA, or crosstalk between the DQ terminal 130DQ and the CA terminal 130CA, wherein an interval between the two terminals is the same. As a result, in the semiconductor package 100 according to the present exemplary embodiment, crosstalk between the channel terminals 130C in an arrow portion may be reduced.

For reference, crosstalk between the DQ terminals 130DQ, the CA terminals 130CA, and the data mask signal (DM) terminals 130DM may be increased. Crosstalk between channel terminals 130C (hereinafter, referred to as "exception channel terminals") other than the three channel terminals may be relatively reduced, and crosstalk between the exception channel terminals 130C and any one of the DQ terminal 130DQ, the CA terminal 130CA, and the DM terminal 130DM may be relatively reduced. In addition, crosstalk may not occur between the channel terminal 130C and the ground terminal 130G.

In addition, FIG. 3B illustrates the first channel region CH0 corresponding to one channel on a lower surface of the package substrate 110 in the semiconductor package 100 according to the present exemplary embodiment. For example, 37 channel terminals 130C and 33 ground terminals 130G may be arranged in the first channel region CH0. The 37 channel terminals 130C may include DQ terminals 130DQ, DM terminals 130DM, CA terminals 130CA, CS terminals 130CS, WCK terminals 130WCK, and DQS terminals 130DQS, and CLK terminals 130CLK. Here, the channel terminals 130C may include 16 DQ terminals 130DQ, two DM terminals 130DM, seven CA terminals 130CA, and two CS terminals 130CS, all of which are single-ended signal terminals. In addition, the channel terminals 130C may include two pairs of (four) WCK terminals 130WCK, two pairs of (four) DQS terminals 130DQS, and one pair of (two) CLK terminals 130CLK, all of which are differential signal terminals.

In addition, the differential signal terminals may each have an N/P pair (a negative terminal and a positive terminal), and thus, crosstalk therebetween is canceled and there is no significant problem. However, the single-ended signal terminals may not cancel crosstalk, and thus, it may be very important to greatly reduce crosstalk to improve SI characteristics. In the semiconductor package 100 according to the present exemplary embodiment, the channel terminals 130C on a lower surface of the package substrate 110 may be arranged according to a preset arrangement rule to greatly reduce crosstalk. Hereinafter, an arrangement rule of the channel terminals 130C on the lower surface of the package substrate 110 is described with reference to FIGS. 4A and 4B.

In FIGS. 4A and 4B, D/C may indicate a DQ terminal 130DQ and a CA terminal 130CA, and DM may indicate a DM terminal 130DM. In addition, EX may indicate a ground terminal 130G and an exception channel terminal 130C other than the DQ terminal 130DQ, the CA terminal 130CA, and the DM terminal 130DM. In an arrangement rule of FIG. 4A, D/C and DM may not be arranged adjacent to each other in the first direction (x direction) and the second direction (y direction) around the D/C and DM. In addition, the D/C and the DM may be arranged adjacent to each other in a diagonal direction around the D/C and the DM. In addition, according to the arrangement rule of FIG. 4B, the EX may be arranged in all directions around the D/C and the DM. That is, the exception channel terminal 130C and the ground terminal 130G included in the EX has little or no influence on crosstalk, therefore it is arranged adjacent to the D/C and DM in the first direction (x direction) and the second direction (y direction).

Referring back to FIG. 3B, the channel terminals 130C may be arranged in the first channel region CH0 of FIG. 3B based on the arrangement rules of FIGS. 4A and 4B. Specifically, the CA terminals 130CA may be arranged in a first column and a second column in the first direction (x direction), the CA terminals 130CA may be arranged in a zigzag in the second direction (y direction), and the ground terminals 130G may be arranged between the CA terminals 130CA. In addition, the CLK terminals 130CLK and the CS terminals 130CS included in the exception channel terminals 130C may also be arranged in the first column and the second column. The exception channel terminals 130C may be freely arranged according to the arrangement rule of FIG. 4B within a range that does not violate the arrangement rule of FIG. 4A.

The DQ terminals 130DQ may be arranged in sixth and seventh columns in the first direction (x direction), and the DQ terminals 130DQ may be arranged in zigzag in the second direction (y direction), and the ground terminals 130G may be arranged between the DQ terminals 130DQ. In addition, the DQ terminals 130DQ, the DM terminals 130DM, the WCK terminals 130WCK and the DQS terminals 130DQS included in the exception channel terminals 130C may be arranged in third to fifth columns in the first direction (x direction). It can be seen that the DQ terminals 130DQ and the DM terminals 130DM are not arranged adjacent to each other in the first direction (x direction) and the second direction (y direction) based on the arrangement rule of FIG. 4A.

As described above, the channel terminals 130C are arranged on the lower surface of the package substrate 110 based on the arrangement rules of FIGS. 4A and 4B, and thus, crosstalk between the channel terminals 130C may be greatly reduced. Accordingly, SI characteristics of the semiconductor package 100 according to the present exemplary embodiment may be greatly improved. In addition, the arrangement rules of FIGS. 4A and 4B may be applied to semiconductor packages 100a to 100d and memory modules 1000, 1000a, and 1000b in FIGS. 6A to 10. Furthermore, the arrangement rules of FIGS. 4A and 4B may also be applied to semiconductor packages and memory modules including single-ended signal terminals in some exemplary embodiments.

In addition, in the semiconductor package 100 according to the present exemplary embodiment, the first channel region CH0 may have a structure for reducing crosstalk with channel terminals of other channel regions. For example, the first channel region CH0 may include a central region CCA, a first coupling region DJ1 of an upper end portion on the central region CCA in the second direction (y direction), and a second coupling region DJ2 of a lower end portion beneath the central region CCA in the second direction. The channel terminals 130C and the ground terminals 130G may be arranged in a two-dimensional array structure in the central region CCA. Here, the upper end portion and the lower end portion have a relative relationship and positions thereof may be exchanged with each other.

The first coupling region DJ1 and the second coupling region DJ2 may each include protrusions, and the channel terminals 130C or the ground terminals 130G may be arranged in the protrusions. For example, the first coupling region DJ1 may include the protrusions in odd-numbered columns in the first direction (x direction), that is, in a first column, a third column, a fifth column, and a seventh column, and the ground terminals 130G may be arranged in the respective protrusions. In addition, the second coupling region DJ2 may include the protrusions in even-numbered columns in the first direction (x direction), that is, in a second column, a fourth column, and a sixth column, and the channel terminals 130C may be arranged in the respective protrusions. In a structure of the first coupling region DJ1 and the second coupling region DJ2, one more ground terminal 130G than the channel terminals 130C may be arranged therein. However, in other exemplary embodiments, the first coupling region DJ1 and the second coupling region DJ2 may each have a structure in which one more channel terminals 130C than the ground terminals 130G are arranged as long as the arrangement rules of FIGS. 4A and 4B are maintained.

In addition, as can be predicted from FIG. 3B, when the first channel region CH0 is coupled to another channel region in the second direction (y direction), channel terminals or ground terminals of other channel regions may be arranged in spaces between the protrusions. For example, channel terminals of other channel regions may be arranged in spaces between the protrusions of the first coupling region DJ1, or ground terminals of other channel regions may be arranged in spaces between the protrusions of the second coupling region DJ2. The coupling structure between the channel regions is described in more detail with reference to FIG. 7. In addition, when the first channel region CH0 is arranged by itself, terminals that do not have influence on crosstalk, for example, ground terminals, may be arranged in spaces between the protrusions.

Figure 5A:
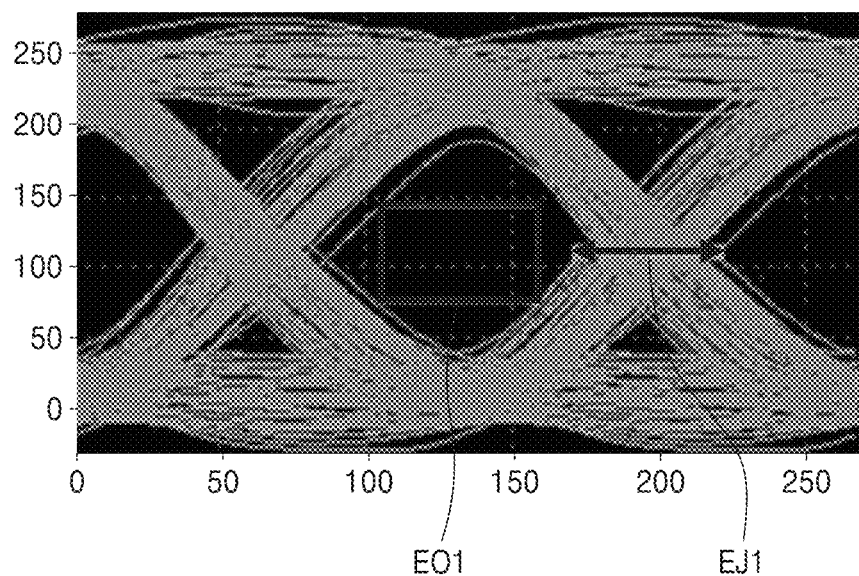
FIGS. 5A and 5B are eye diagram photographs of the package substrate according to the comparative example in FIG. 3A and a package substrate of the semiconductor package in FIG. 1.
Figure 5B:
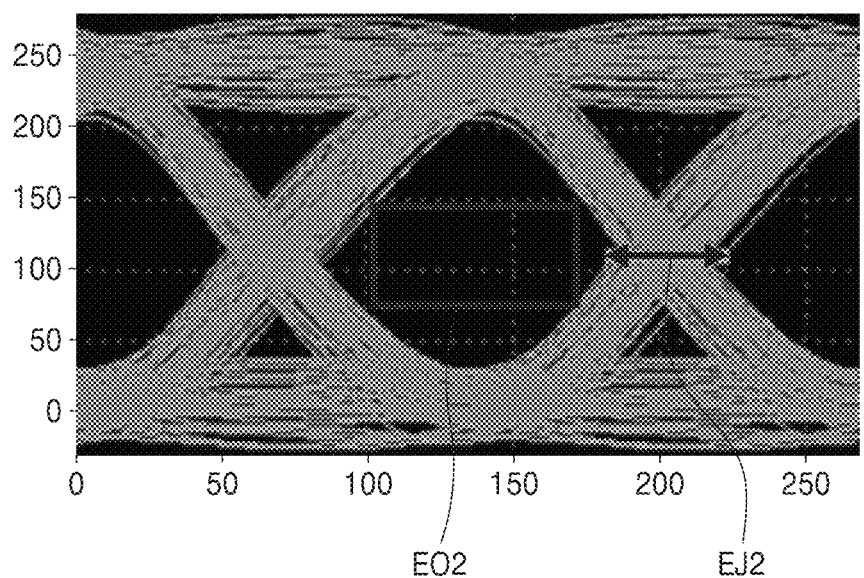

FIGS. 5A and 5B are eye diagram photographs of a package substrate according to a comparative example of FIG. 3A and a package substrate of the semiconductor package of FIG. 1, wherein channel terminals may be arranged on a lower surface of the package substrate according to the comparative example as illustrated in FIG. 3A. Channel terminals may be arranged on a lower surface of a package substrate of the semiconductor package of FIG. 1 as illustrated in FIG. 3B. The x axis represents time whose unit is picosecond (ps), and the y axis indicates an intensity whose unit is arbitrary unit.

In the eye diagrams of FIGS. 5A and 5B, rectangular boxes indicate eye open values EO1 and E02, and arrows indicate eye jitter values EJ0 and EJ1. Eye open and eye jitter are also referred to as respectively an eye width and timing jitter. A package substrate according to a comparative example of FIG. 5A has a small eye open value EO1 and a great eye jitter value EJ1. In contrast to this, the package substrate 110 of the semiconductor package 100 in FIG. 1 has a great eye open value EO2 and a small eye jitter value EJ2. In detail, when a unit interval (UI) is about 133.34 ps, the package substrate according to the comparative example has the eye open value EO1 of about 53.9 ps and the eye jitter value EJ1 of about 46.7 ps. In contrast to this, the package substrate 110 of the semiconductor package 100 in FIG. 1 has the eye open value EO2 of about 69.3 ps, and the eye jitter value EJ2 of about 36.9 ps. Accordingly, it can be seen that a ratio between the eye open values increases from 53.9/133.34*100=40.4% to 69.3/133.34*100=52.0%, and SI characteristics are improved by 11.6%.

For reference, the UI may indicate an interval between portions where rising edges of a waveform intersect with falling edges thereof, eye open may indicate a time interval which is a rectangular box for sampling a received signal, and eye jitter may indicate a width of an intersection in which a rising edge of a waveform intersects with a falling edge thereof. In general, the greater the eye open value and the smaller the eye jitter value, the better the SI characteristics. When noise is introduced due to crosstalk, the eye open value is reduced and the eye jitter value is increased. As a result, as can be seen from the eye open values and eye jitter values of FIGS. 5A and 5B, signal characteristics of the package substrate 110 of the semiconductor package 100 according to the present exemplary embodiment of FIG. 1 are better than signal characteristics of the package substrate according to the comparative example of FIG. 3.

Figure 6A:
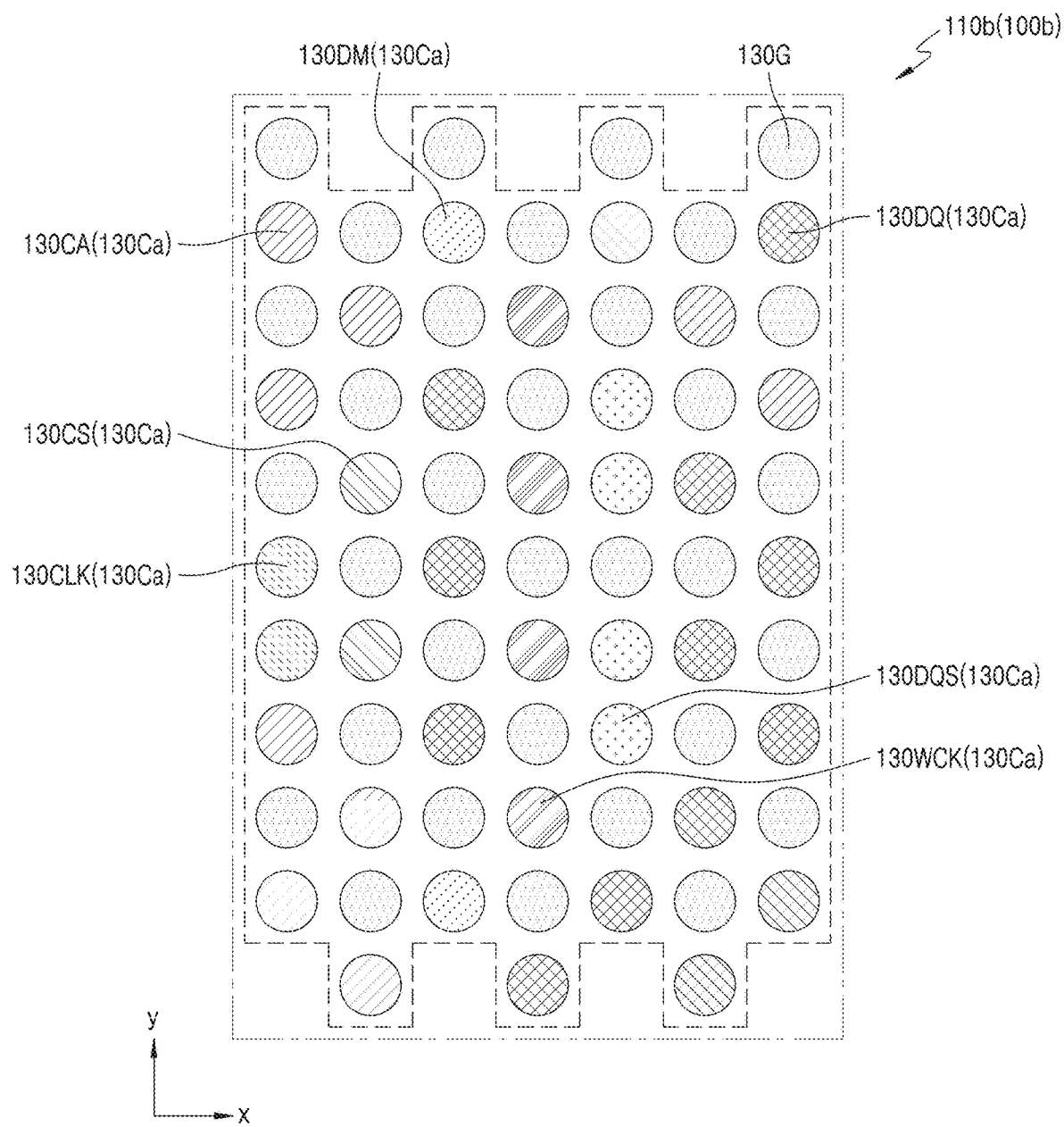
FIGS. 6A to 6C are plan views illustrating parts of package substrates of semiconductor packages according to exemplary embodiments of the inventive concept.
Figure 6B:
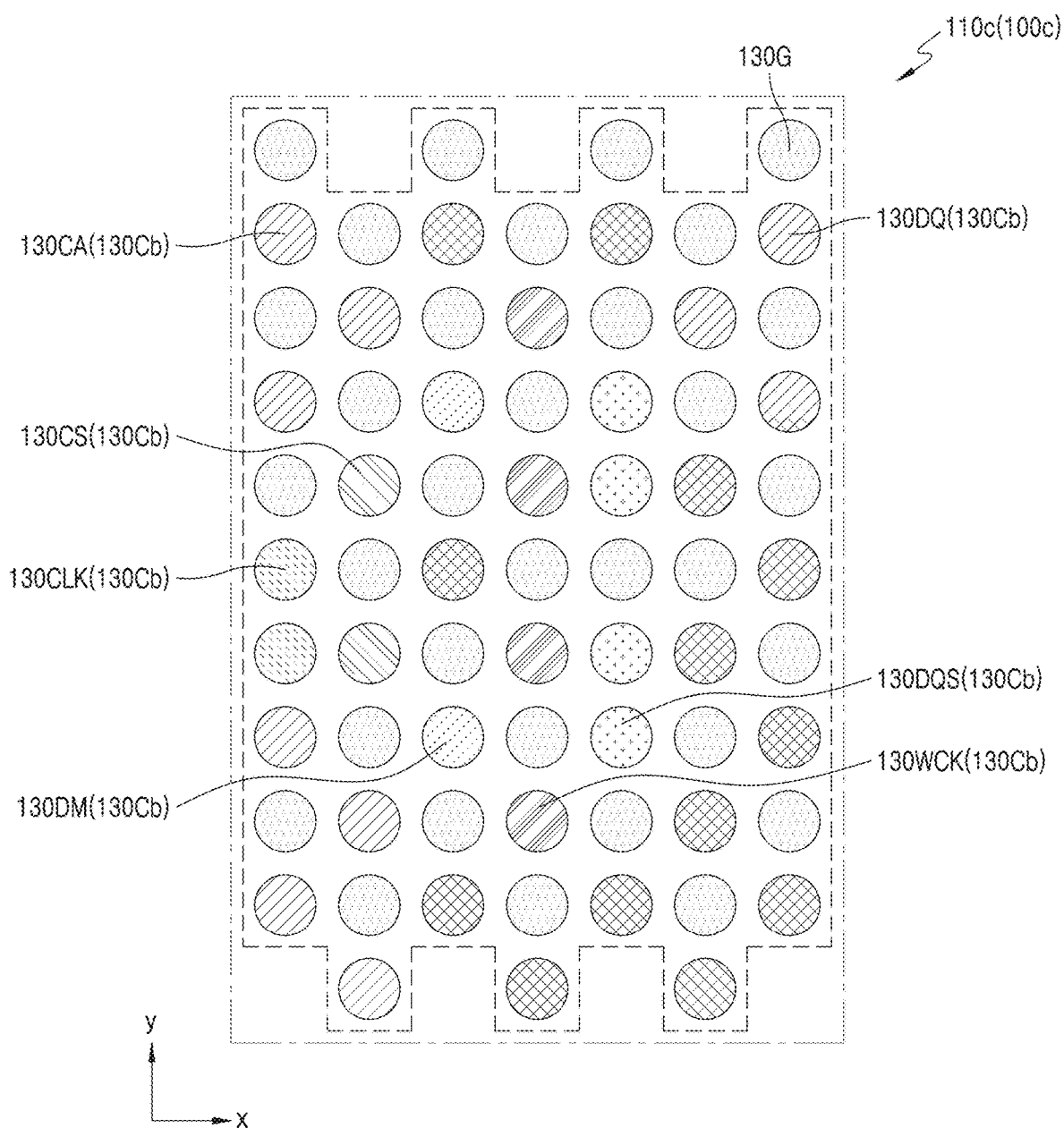
Figure 6C:
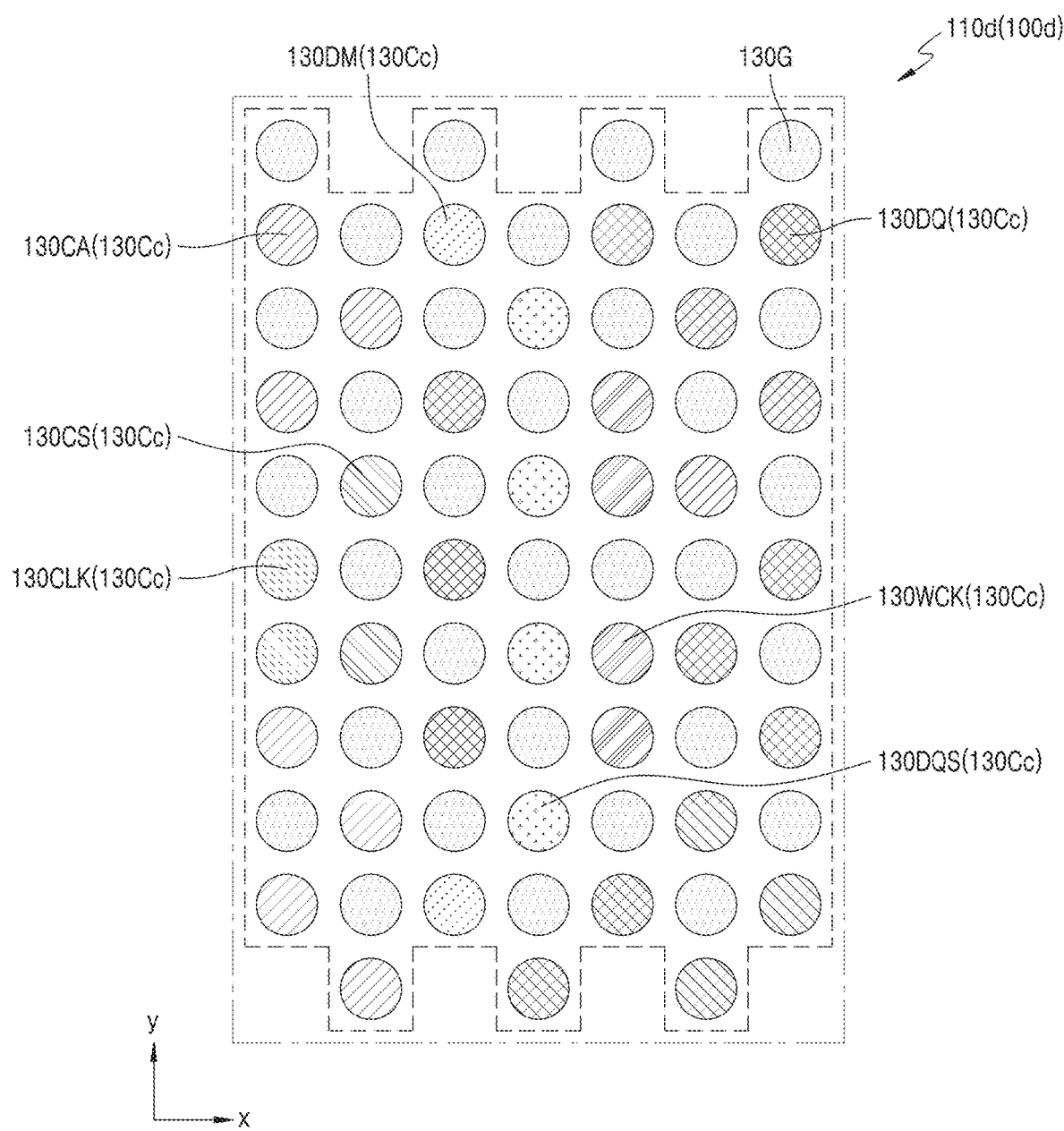

FIGS. 6A to 6C are plan views illustrating parts of package substrates of semiconductor packages according to exemplary embodiments of the inventive concept. The descriptions previously given with reference to FIGS. 1 to 4B are omitted as redundant.

Referring to FIG. 6A, a semiconductor package 100b according to the present exemplary embodiment may be different from the semiconductor package 100 of FIG. 3B in the arrangement structure of the channel terminals 130Ca on a lower surface of a package substrate 110b. Specifically, in the semiconductor package 100b according to the present exemplary embodiment, an arrangement structure of the channel terminals 130Ca in a first column, a second column, a fifth column, a sixth column, and a seventh column in the first direction (x direction) among the channel terminals 130Ca on the lower surface of the package substrate 110b may be substantially the same as the arrangement structure of the channel terminals 130C on the lower surface of the package substrate 110 of the semiconductor package 100 of FIG. 3B.

In addition, an arrangement structure of the channel terminals 130Ca in a third column and a fourth column in the first direction (x direction) among the channel terminals 130Ca on the lower surface of the package substrate 110b may be different from the arrangement structure of the channel terminals 130C on the lower surface of the package substrate 110 of the semiconductor package 100 in FIG. 3. Specifically, in the semiconductor package 100 of FIG. 3B, the WCK terminals 130WCK in the fourth column among the channel terminals 130C in the third and fourth columns in the first direction (x direction) may be arranged adjacent two-by-two in the second direction (y direction). However, in the semiconductor package 100b according to the present exemplary embodiment, the channel terminals 130Ca in the third and fourth columns in the first direction (x direction) may be arranged in a zigzag in the second direction (y direction), and ground terminals may be arranged therebetween. In other words, the DM terminals 130DM, the DQ terminals 130DQ, and the WCK terminals 130WCK may be arranged in a zigzag in the second direction (y direction), and the ground terminals 130G may be arranged therebetween. Accordingly, none of the channel terminals 130Ca in the third and fourth columns in the first direction (x direction) may be arranged adjacent in the second direction.

A semiconductor package 100c according to the present exemplary embodiment of FIG. 6B may be different from the semiconductor package 100b of FIG. 6A in an arrangement structure of channel terminals 130Cb on a lower surface of a package substrate 110c. Specifically, in the semiconductor package 100c according to the present exemplary embodiment, an arrangement structure of the channel terminals 130Cb in a first column, a second column, a fifth column, a sixth column, and a seventh column in the first direction (x direction) among the channel terminals 130Cb on a lower surface of the package substrate 110c may be substantially the same as the arrangement structure of the channel terminals 130Ca on the lower surface of the package substrate 110b of the semiconductor package 100b of FIG. 6A.

In addition, an arrangement structure of the channel terminals 130Cb in the third and fourth columns in the first direction (x direction) among the channel terminals 130Cb on the lower surface of the package substrate 110c may be different from the arrangement structure of the channel terminals 130Ca on the lower surface of the package substrate 110b of the semiconductor package 100b in FIG. 6A. Specifically, in the semiconductor package 100b of FIG. 6A, two DM terminals 130DM among the channel terminals 130Ca in the third and fourth columns in the first direction (x direction) may be arranged in the outermost portions in the second direction (y direction). However, in the semiconductor package 100c according to the present exemplary embodiment, two DQ terminals 130DQ among the channel terminals 130Cb in the third and fourth columns in the first direction (x direction) may be arranged in the outermost portions in the second direction (y direction). Also in the semiconductor package 100c according to the present exemplary embodiment, the DM terminals 130DM, the DQ terminals 130DQ, and the WCK terminals 130WCK may be arranged in a zigzag in the second direction (y direction), and ground terminals 130G may be arranged therebetween.

In a semiconductor package 100d according to the present exemplary embodiment in FIG. 6C, an arrangement structure of channel terminals 130Cc on a lower surface of a package substrate 110d may be different from the arrangement structure of the semiconductor package 100b in FIG. 6A. Specifically, in the semiconductor package 100d according to the present exemplary embodiment, an arrangement structure of the channel terminals 130Cc in a first column, a second column, a third column, a sixth column, and a second column in the first direction (x direction) among the channel terminals 130Cc on the lower surface of the package substrate 110d may be substantially the same as the arrangement structure of the channel terminals 130Ca on the lower surface of the package substrate 110b of the semiconductor package 100b of FIG. 6A.

In addition, an arrangement structure of the channel terminals 130Cc in fourth and fifth columns in the first direction (x direction) among the channel terminals 130Cc on the lower surface of the package substrate 110d may be different from the arrangement structure of the channel terminals 130Ca on the lower surface of the package substrate 110b of the semiconductor package 100b. Specifically, in the semiconductor package 100b of FIG. 6A, the DQS terminals 130DQS in the fifth column among the channel terminals 130Cc in the fourth and fifth columns in the first direction (x direction) may be arranged adjacent two-by-two in the second direction (y direction). However, in the semiconductor package 100d according to the present exemplary embodiment, positions of columns of the WCK terminals 130WCK and the DQS terminals 130DQS of the channel terminals 130Cc in the fourth and fifth columns in the first direction (x direction) may be changed, and thus, the DQS terminals 130DQS and the ground terminals 130G in the fourth column may be alternately arranged in the second direction (y direction), and the WCK terminals 130WCK in the fifth column may be arranged adjacent two-by-two in the second direction (y direction). In addition, the DM terminals 130DM, the DQ terminals 130DQ, and the DQS terminals 130DQS in the third and fourth columns may be arranged in a zigzag in the second direction (y direction), and ground terminals 130G may be arranged therebetween.

Figure 7:
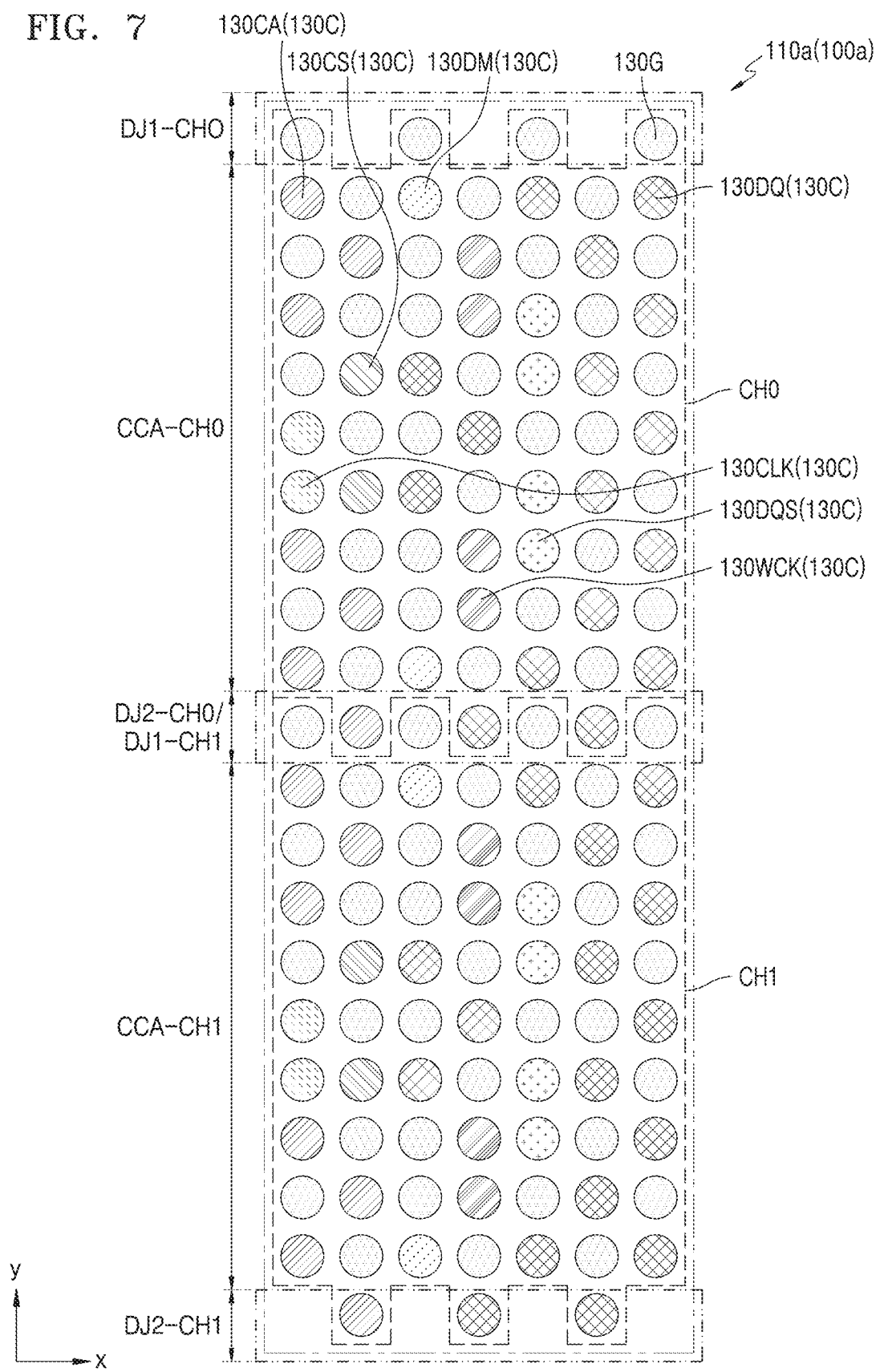
FIG. 7 is a plan view illustrating a part of a package substrate of a semiconductor package according to an exemplary embodiment of the inventive concept.

FIG. 7 is a plan view illustrating a part of a package substrate of a semiconductor package according to an exemplary embodiment of the inventive concept and illustrates the first channel region CH0 and the second channel region CH1 on the lower surface of the package substrate 100a in FIG. 2B. The descriptions previously given with reference to FIGS. 1 to 4B are omitted as redundant.

In the semiconductor package 100a according to the present exemplary embodiment illustrated in FIG. 7, each of the first channel region CH0 and the second channel region CH1 on the lower surface of the package substrate 110a may have substantially the same structure as the first channel region CH0 on the lower surface of the package substrate 110 of the semiconductor package 100 of FIG. 3B. In addition, types and arrangement structures of channel terminals 130C and ground terminals 130G arranged in each of the first channel region CH0 and the second channel region CH1 may be substantially the same as the types and arrangement structures of the channel terminals 130C and the ground terminals 130G arranged in the first channel region CH0 of the semiconductor package 100 of FIG. 3B.

In addition, in the semiconductor package 100a according to the present exemplary embodiment, the first channel region CH0 and the second channel region CH1 may be coupled to each other in a dovetail joint structure in the second direction (y direction) and may be sequentially arranged. Specifically, the first channel region CH0 may include a central region CCA-CH0, a first coupling region DJ1-CH0, and a second coupling region DJ2-CH0, and the second channel region CH1 may include a central region CCA-CH1, a first coupling region DJ1-CH1, and a second coupling region DJ2-CH1. In addition, the second coupling region DJ2-CH0 in the first channel region CH0 may be coupled to the first coupling region DJ1-CH1 in the second channel region CH1 in a dovetail joint structure. Accordingly, three channel terminals 130C of the second coupling region DJ2-CH0 in the first channel region CH0 and four ground terminals 130G of the first coupling region DJ1-CH1 in the second channel region CH1 may be alternately arranged in the first direction (x direction).

In addition, the dovetail joint structures in the second direction (y direction) have a relative relationship, and the coupling structures of adjacent channel regions may be opposite to each other. For example, the second coupling region DJ2-CH1 in the second channel region CH1 may be coupled to the first coupling region DJ1-CH0 in the first channel region CH0 in a dovetail joint structure. Accordingly, the four ground terminals 130G of the first coupling region DJ1-CH0 in the first channel region CH0 and the three channel terminals 130C of the second coupling region DJ2-CH1 in the second channel region CH1 may be alternately arranged in the first direction (x direction).

Although coupling structures of two channel regions are described above, the same coupling structures may also be applied to coupling structures of three or more channel regions. For example, the three or more channel regions may have substantially the same structure and may be coupled to an adjacent channel region in a dovetail joint structure in the second direction (y direction). In addition, each of the channel regions may have a structure rotated by 90° and may also be coupled to an adjacent channel region in a dovetail joint structure in the first direction (x direction). In addition, the arrangement structures of the channel terminals and ground terminals of each of the plurality of channel regions are not limited to the arrangement structures of the channel terminals 130C and the ground terminals 130G in the first channel region CH0 of the semiconductor package 100 of FIG. 3B. For example, the channel terminals and ground terminals of each of the plurality of channel regions may also have the arrangement structures of the channel terminals 130Ca to 130Cc and the ground terminal 130G in the first channel regions CH0 of the semiconductor packages 100b to 100d of FIGS. 6A to 6C. In addition, the channel terminals and ground terminals of each of the plurality of channel regions may have different arrangement structures based on the arrangement rules of FIGS. 4A and 4B.

Figure 8:
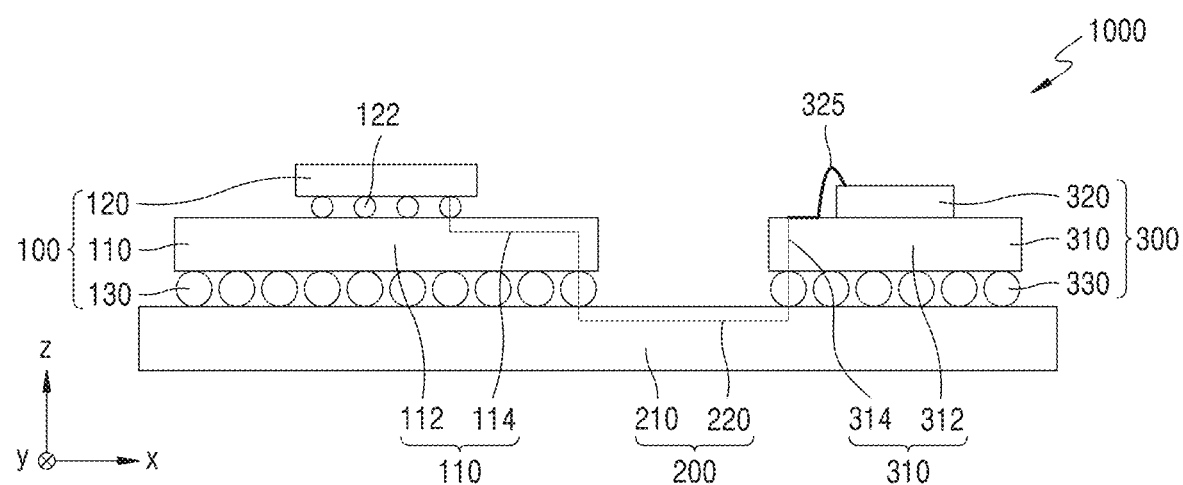
FIG. 8 is a schematic cross-sectional view illustrating a memory module including a semiconductor package, according to an exemplary embodiment of the inventive concept.

FIG. 8 is a schematic cross-sectional view illustrating a memory module including a semiconductor package, according to an exemplary embodiment of the inventive concept. The descriptions previously given with reference to FIGS. 1 to 7 are omitted as redundant.

Referring to FIG. 8, a memory module 1000 including the semiconductor package according to the present exemplary embodiment may include a first semiconductor package 100, a board substrate 200, and a second semiconductor package 300.

The first semiconductor package 100 may include a first package substrate 110, a first semiconductor chip 120, and first connection terminals 130. The first semiconductor package 100 may include, for example, the semiconductor package 100 of FIG. 1. Accordingly, the first package substrate 110, the first semiconductor chip 120, and the first connection terminals 130 respectively correspond to the package substrate 110, the semiconductor chip 120, and the connection terminals 130 of the semiconductor package 100 in FIG. 1. In addition, the first semiconductor package 100 is not limited to the semiconductor package 100 of FIG. 1 and may be any one of the semiconductor packages 100a to 100d in FIGS. 6A to 7.

The board substrate 200 may include a body layer 210 and wires 220. The body layer 210 may be formed of various materials. For example, the body layer 210 may be formed of silicon, ceramic, an organic material, glass, an epoxy resin, or on the like, depending on the type of the board substrate 200. In the memory module 1000 according to the present exemplary embodiment, the board substrate 200 may include a PCB, and the body layer 210 may be formed of a material based on an epoxy resin. The body layer 210 may constitute an external shape of the board substrate 200. For example, the body layer 210 may have a rectangular plate shape. However, the shape of the body layer 210 is not limited to a rectangular plate shape.

The wires 220 may be arranged on upper and lower surfaces and inside of the body layer 210. FIG. 8 illustrates only one wire 220 for the purpose of illustrating a signal path, but a plurality of wires 220 may be arranged in the body layer 210. A protective layer may be formed on the lower and upper surfaces of the body layer 210. The protective layer may cover and protect the wires on the upper and lower surfaces of the body layer 210. The protective layer may be formed of, for example, SR. However, the material of the protective layer is not limited to SR. In addition, a substrate pad may be disposed on the upper surface of the body layer 210. The substrate pads may be respectively connected to the wires 220 and may be exposed with respect to the protective layer. The first connection terminals 130 and the second connection terminals 330 may be arranged on the substrate pad.

The second semiconductor package 300 may include a second package substrate 310, a second semiconductor chip 320, and second connection terminals 330. The second package substrate 310 may include a body layer 312 and wires 314. The body layer 312 may be formed of various materials. For example, the body layer 312 may be formed of silicon, ceramic, an organic material, glass, an epoxy resin, or on the like, depending on the type of the second package substrate 310. In the memory module 1000 according to the present exemplary embodiment, the second package substrate 310 of the second semiconductor package 300 may include a PCB, and the body layer 312 may be formed of a material based on an epoxy resin. The body layer 312 may have, for example, a rectangular plate shape. However, the shape of the body layer 312 is not limited to a rectangular plate shape.

The wires 314 may be arranged on upper and lower surfaces and inside of the body layer 312. FIG. 8 illustrates only one wire 314 for the purpose of illustrating a signal path, but a plurality of wires 314 may be arranged in the body layer 312. In addition, the wires 314 may be arranged in a single layer or multiple layers in the body layer 312. A substrate pad may be on the upper and lower surfaces of the body layer 312. The substrate pads may be respectively connected to the wires 314. The substrate pad may include an upper substrate pad on the upper surface of the body layer 312 and a lower substrate pad on the lower surface of the body layer 312. The upper substrate pad may be connected to a chip pad of the second semiconductor chip 320 through a wire 325. That is, the second semiconductor chip 320 may be mounted on the second package substrate 310 in a wire bonding structure. However, in some exemplary embodiments, the second semiconductor chip 320 may be mounted on the second package substrate 310 in a flip-chip structure. The second connection terminals 330 may be arranged on a lower substrate pad.

The second semiconductor chip 320 may include, for example, a memory chip. For example, the second semiconductor chip 320 may include a volatile memory device such as DRAM or SRAM, or a nonvolatile memory device such as a flash memory. For example, in the memory module 1000 according to the present exemplary embodiment, the second semiconductor chip 320 may include a DRAM chip including a plurality of DRAM devices. In addition, the second semiconductor chip 320 may include a DDR SDRAM chip used in a mobile system.

Figure 9:
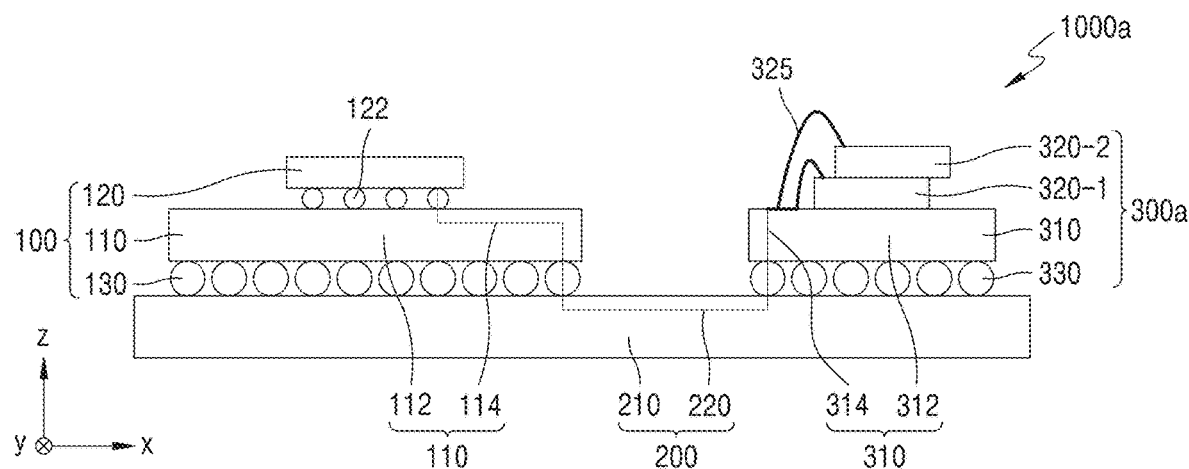
FIG. 9 is a schematic cross-sectional view illustrating a memory module including a semiconductor package, according to an exemplary embodiment of the inventive concept.

FIG. 9 is a schematic cross-sectional view illustrating a memory module including a semiconductor package, according to an exemplary embodiment of the inventive concept. The previous description given with reference to FIG. 8 is omitted as redundant.

Referring to FIG. 9, a memory module 1000a according to the present exemplary embodiment may be different from the memory module 1000 of FIG. 8 in a structure of a second semiconductor package 300a. Specifically, in the memory module 1000a according to the present exemplary embodiment, the second semiconductor package 300a may include two second semiconductor chips 320-1 and 320-2. The two second semiconductor chips 320-1 and 320-2 may include the second semiconductor chip 320-1 of a first layer and the second semiconductor chip 320-2 of a second layer. Each of the second semiconductor chip 320-1 of the first layer and the second semiconductor chip 320-2 of the second layer may include a memory chip, for example, a DRAM chip and may be connected to an upper substrate pad of the second package substrate 310. In the memory module 1000a according to the present exemplary embodiment, the number of second semiconductor chips included in the second semiconductor package 300a is not limited to 2. For example, in some exemplary embodiments, the second semiconductor package 300a may include three or more second semiconductor chips.

Figure 10:
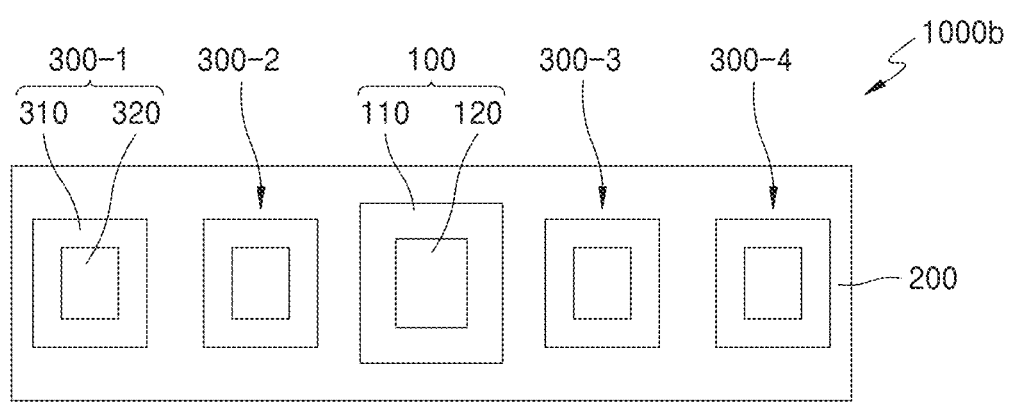
FIG. 10 is a schematic plan view illustrating a memory module including a semiconductor package, according to an exemplary embodiment of the inventive concept.

FIG. 10 is a schematic plan view illustrating a memory module including a semiconductor package, according to an exemplary embodiment of the inventive concept. The descriptions previously given with reference to FIGS. 8 and 9 are omitted as redundant.

Referring to FIG. 10, a memory module 1000b according to the present exemplary embodiment may include a plurality of second semiconductor packages, and thus, the memory module 1000b may be different from the memory module 1000 of FIG. 8. Specifically, the memory module 1000b according to the present exemplary embodiment may include four second semiconductor packages 300-1 to 300-4. Each of the four second semiconductor packages 300-1 to 300-4 may include the second package substrate 310 and the second semiconductor chip 320. In the memory module 1000b of FIG. 10, four second semiconductor packages may be arranged two-by-two on both sides of the first semiconductor package 100. However, an arrangement structure of the second semiconductor packages is not limited thereto. For example, all four second semiconductor packages may be arranged on either side of the first semiconductor package 100.

In addition, the number of second semiconductor packages included in the memory module 1000b according to the present exemplary embodiment is not limited to 4. For example, in some exemplary embodiments, the memory module may include two, three, five, or more second semiconductor packages. In addition, each of the plurality of second semiconductor packages may include one second semiconductor chip or include a plurality of second semiconductor chips.

While the inventive concept has been particularly shown and described with reference to exemplary embodiments thereof, it will be understood that various changes and modifications in form and details may be made therein without departing from the spirit and scope of the following claims.

What is claimed is:
1. A semiconductor package comprising:
a package substrate;
a semiconductor chip mounted on the package substrate; and
connection terminals arranged on a lower surface of the package substrate including first channel terminals and first ground terminals in a first channel region, and including second channel terminals and second ground terminals in a second channel region,
wherein the connection terminals are arranged in a two-dimensional array structure in a first direction and a second direction perpendicular to the first direction,
wherein two adjacent terminals with a shortest distance therebetween among data signal (DQ) terminals and command and address signal (CA) terminals included in the connection terminals are arranged in a diagonal direction between the first direction and the second direction, wherein some of the DQ terminals and the CA terminals of the first channel terminals are arranged at even-numbered positions in the first direction in one of an upper end portion and a lower end portion of the first channel region in the second direction, wherein some of the first ground terminals are arranged at odd-numbered positions in the first direction in one of the lower end portion and the upper end portion of the first channel region in the second direction, wherein arrangement structures of the second channel terminals and the second ground terminals in the second channel region are substantially the same as arrangement structures of the first channel terminals and the first ground terminals in the first channel region, and wherein DQ terminals and CA terminals of the second channel terminals in one of an upper end portion and a lower end portion of the second channel region in the second direction, and the first ground terminals in one of the lower end portion and the upper end portion of the first channel region are alternately arranged in the first direction, or the second ground terminals in one of the upper end portion and the lower end portion of the second channel region in the second direction, and the DQ terminals and the CA terminals of the first channel terminals in one of the lower end portion and the upper end portion of the first channel region are alternately arranged in the first direction.

2. The semiconductor package of claim 1, wherein the semiconductor chip includes a logic chip, and the DQ terminals and the CA terminals are arranged in a zigzag in the second direction.

3. The semiconductor package of claim 2, wherein at least one ground terminal is disposed between two adjacent terminals included in the DQ terminals and the CA terminals in any one of the first direction and the second direction.

4. The semiconductor package of claim 1, wherein two data mask signal (DM) terminals of the connection terminals are arranged with at least one ground terminal therebetween.

5. The semiconductor package of claim 1, wherein the connection terminals include channel terminals and ground terminals arranged in a channel region, and the channel region includes a rectangular central region and coupling regions of an upper end portion and a lower end portion on and beneath the rectangular central region in the second direction.

6. The semiconductor package of claim 5, wherein some of the channel terminals and the ground terminals are arranged in a two-dimensional array structure in the rectangular central region, further ground terminals are arranged in the first direction at odd-numbered positions in the coupling region of one of the upper end portion and the lower end portion, and the DQ terminals and the CA terminals, which are further channel terminals, are arranged in the first direction at even-numbered positions in the coupling region of one of the lower end portion and the upper end portion.

7. The semiconductor package of claim 6, wherein the CA terminals and the ground terminals are arranged in a zigzag in the second direction in two left columns in the first direction, two clock signal (CLK) terminals and two chip select signal (CS) terminals are arranged between the CA terminals and the ground terminals, the DQ terminals and the ground terminals are arranged in a zigzag in the second direction in two right columns in the first direction, the DQ terminals, data mask (DM) terminals, data channel clock signal (WCK) terminals, and data strobe signal (DQS) terminals are arranged in a plurality of central columns in the first direction, and only the ground terminals are arranged adjacent to each other in each of the DM terminals in the first direction and the second direction.

8. The semiconductor package of claim 1, wherein the package substrate is mounted on a board substrate through the connection terminals, at least one memory semiconductor package is mounted on the board substrate, and the connection terminals are connected to connection terminals of the at least one memory semiconductor package through wires of the board substrate.

9. A memory module comprising:

a first semiconductor package including a first package substrate, a first semiconductor chip mounted over the first package substrate, and connection terminals arranged on a lower surface of the first package substrate;

a second semiconductor package including a second package substrate and a second semiconductor chip mounted on the second package substrate; and a board substrate over which the first semiconductor package and the second semiconductor package are mounted and in which wires connecting the first package substrate to the second package substrate are arranged, wherein the connection terminals are arranged in a two-dimensional array structure in a first direction and a second direction perpendicular to the first direction, the connection terminals including first channel terminals and first ground terminals in a first channel region, and including second channel terminals and second ground terminals in a second channel region, wherein two adjacent terminals with a shortest distance therebetween among data signal (DQ) terminals and command and address signal (CA) terminals included in the connection terminals are arranged in a diagonal direction between the first direction and the second direction, wherein some of the DQ terminals and the CA terminals of the first channel terminals are arranged at even-numbered positions in the first direction in one of an upper end portion and a lower end portion of the first channel region in the second direction, wherein some of the first ground terminals are arranged at odd-numbered positions in the first direction in one of the lower end portion and the upper end portion of the first channel region in the second direction, wherein arrangement structures of the second channel terminals and the second ground terminals in the second channel region are substantially the same as arrangement structures of the first channel terminals and the first ground terminals in the first channel region, and wherein DQ terminals and CA terminals of the second channel terminals in one of an upper end portion and a lower end portion of the second channel region in the second direction, and the first ground terminals in one of the lower end portion and the upper end portion of the first channel region are alternately arranged in the first direction, or the second ground terminals in one of the upper end portion and the lower end portion of the second channel region in the second direction, and the DQ terminals and the CA terminals of the first channel terminals in one of the lower end portion and the upper end portion of the first channel region are alternately arranged in the first direction.

10. The memory module of claim 9, wherein
the first semiconductor chip includes a logic chip,
the second semiconductor chip includes a memory chip,
the DQ terminals and the CA terminals are arranged in a zigzag in the second direction, and
at least one ground terminal is between two adjacent terminals in one of the first direction and the second direction among the DQ terminals and the CA terminals.

11. The memory module of claim 9, wherein
the connection terminals include channel terminals and ground terminals arranged in at least two channel regions,
each of the at least two channel regions includes a rectangular central region and coupling regions of an upper end portion and a lower end portion on and beneath the rectangular central region in the second direction,
the channel terminals and the ground terminals are arranged in a two-dimensional array structure in the rectangular central region,
the ground terminals are arranged in the first direction at odd-numbered positions in the coupling region of one of the upper end portion and the lower end portion,
DQ terminals and CA terminals of the channel terminals are arranged in the first direction at even-numbered positions in the coupling region of one of the lower end portion and the upper end portion, and
wherein the first channel region and the second channel region among the at least two channel regions are adjacent to each other in the second direction, and
DQ terminals and CA terminals in the first channel region and the ground terminals in the second channel region are alternately arranged in the first direction in the coupling regions, or
the ground terminals in the first channel region and DQ terminals and CA terminals in the second channel region are alternately arranged in the first direction in the coupling regions.

12. A memory module comprising:
a first semiconductor package including a first package substrate, a first semiconductor chip mounted on the first package substrate, and connection terminals arranged on a lower surface of the first package substrate, the connection terminals including first channel terminals and first ground terminals in a first channel region, and including second channel terminals and second ground terminals in a second channel region;
a plurality of second semiconductor packages, each including a second package substrate and at least one second semiconductor chip mounted on the second package substrate; and
a board substrate on which the first semiconductor package and the plurality of second semiconductor packages are mounted, and in which wires connecting the first package substrate to the plurality of second package substrates are arranged,
wherein the connection terminals are arranged in a two-dimensional array structure in a first direction and a second direction perpendicular to the first direction and include channel terminals and ground terminals arranged in at least two channel regions,
wherein two adjacent terminals with a shortest distance therebetween among data signal (DQ) terminals and command and address signal (CA) terminals included in the connection terminals are arranged in a diagonal direction between the first direction and the second direction,
wherein the first channel region and the second channel region which are adjacent to each other among the at least two channel regions are coupled in a dovetail joint structure,
wherein some of the DQ terminals and the CA terminals of the first channel terminals are arranged at even-numbered positions in the first direction in one of an upper end portion and a lower end portion of the first channel region in the second direction,
wherein some of the first ground terminals are arranged at odd-numbered positions in the first direction in one of the lower end portion and the upper end portion of the first channel region in the second direction,
wherein arrangement structures of the second channel terminals and the second ground terminals in the second channel region are substantially the same as arrangement structures of the first channel terminals and the first ground terminals in the first channel region, and
wherein DQ terminals and CA terminals of the second channel terminals in one of an upper end portion and a lower end portion of the second channel region in the second direction, and the first ground terminals in one of the lower end portion and the upper end portion of the first channel region are alternately arranged in the first direction, or
the second ground terminals in one of the upper end portion and the lower end portion of the second channel region in the second direction, and the DQ terminals and the CA terminals of the first channel terminals in one of the lower end portion and the upper end portion of the first channel region are alternately arranged in the first direction.

13. The memory module of claim 12, wherein
the first semiconductor chip includes a logic chip,
the at least one second semiconductor chip includes a memory chip, and
the DQ terminals and the CA terminals are arranged in a zigzag in the second direction.

14. The memory module of claim 12, wherein
at least one ground terminal is disposed between two adjacent terminals in one of the first direction and the second direction among the DQ terminals and the CA terminals, and
two data mask signal (DM) terminals of the connection terminals are arranged with at least one ground terminal therebetween.

15. The memory module of claim 12, wherein
the first channel region and the second channel region are adjacent to each other in the second direction,
each of the first channel region and the second channel region includes a rectangular central region and coupling regions of an upper end portion and a lower end portion on and beneath the rectangular central region in the second direction, first channel terminals and first ground terminals are arranged in the first channel region, second channel terminals and second ground terminals are arranged in the second channel region, and arrangement structures of the second channel terminals and the second ground terminals in the second channel region are substantially the same as arrangement structures of the first channel terminals and the first ground terminals in the first channel region.

16. The memory module of claim 15, wherein, in each of the first channel region and the second channel region, some of the DQ terminals and the CA terminals are arranged at even-numbered positions in the first direction in the coupling region of one of the upper end portion and the lower end portion, and some of the ground terminals are arranged at odd-numbered positions in the first direction in the coupling region of one of the lower end portion and the upper end portion, and the coupling region of one of the upper end portion and the lower end portion in the second channel region is coupled to the coupling region of one of the lower end portion and the upper end portion in the first channel region in a dovetail joint structure.

* * * * *